Jan. 10, 1961 J. PHILIPS 2,967,793

SEMICONDUCTOR DEVICES WITH BI-POLAR INJECTION CHARACTERISTICS

Filed Feb. 24, 1959 3 Sheets-Sheet 1

WITNESSES

John E. Healey, Jr.

Charles L. Menzemer

INVENTOR

John Philips

BY

Frederick Shapoe

ATTORNEY

SEMICONDUCTOR DEVICES WITH BI-POLAR INJECTION CHARACTERISTICS

Filed Feb. 24, 1959 3 Sheets-Sheet 2

United States Patent Office 2,967,793

Patented Jan. 10, 1961

2,967,793

SEMICONDUCTOR DEVICES WITH BI-POLAR INJECTION CHARACTERISTICS

John Philips, Pittsburgh, Pa., assignor to Westinghouse Electric Corporation, East Pittsburgh, Pa., a corporation of Pennsylvania Filed Feb. 24, 1959, Ser. No. 795,296

9 Claims. (Cl. 148—33)

This invention relates generally to semiconductor devices and more particularly to semiconductor devices with bi-polar injection characteristics.

An object of the present invention is to provide a semiconductor device in which a flow of minority carriers can be initiated by an input voltage irrespective of the polarity of the input voltage.

Another object of the present invention is to provide a hyperconductive negative resistance semiconductor device in which a flow of minority carriers can be initiated by an input voltage irrespective of the polarity of the input voltage.

Another object of the present invention is to provide a semiconductor device in which the energizing current passes between a first emitter element and a second emitter element through a base element.

Other objects of the invention will, in part, be obvious and will, in part, appear hereinafter.

For a better understanding of the nature and objects of the invention, reference should be had to the following detailed description and drawings, in which:

Figures 1 to 7, inclusive, are a series of views illustrating one method of preparing a semiconductor device incorporating the teachings of this invention. Figures 1 to 5 and 7 are vertical cross-sectional views, while Figure 6 is a top plan view.

Figure 1:
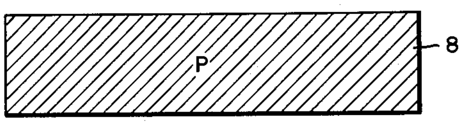

There have been developed a number of diode and triode devices having three and four successive semiconductor regions of alternating characteristics in series which conduct an electric current freely when biased with one polarity, hereinafter called forward polarity, and when biased with an opposite polarity, hereinafter called reverse polarity, the devices exhibit a high resistance up to a critical voltage and amperage so that very little current flows up to said critical point. However, when this critical point is reached, the device switches to an extremely low resistance state and substantial currents flow in the reverse direction. These devices are hyperconductive negative resistant devices.

In some instances these hyperconductive negative resistance devices have been so constructed that they also have a high resistance to current flow in a forward direction. However, when current flows in the reverse direction, they will exhibit the critical switching characteristic described above. In these devices the breakover or switching may be effected in a period of time of about 0.1 microsecond and will recover their full resistance characteristics in about 1 microsecond when the voltage is decreased momentarily below the critical value.

In accordance with the present invention and attainment of the foregoing objects, there is provided a hyperconductive semiconductor switching and control device.

Briefly, the semiconductor device of this invention comprises two separate semiconductor elements of one type of semiconductivity (hereinafter designated as the first and second emitters) cooperatively affixed to separate portions of one semiconductor element of the opposite type of semiconductivity (hereinafter designated a first base layer), and a third element of the first type of semiconductivity (hereinafter designated as a second base layer) affixed to a third separate portion of the said one semiconductor element, the third member having intimately joined thereto a mass-of-metal (hereinafter identified as m) providing for injection of minority carriers into the third member when electrically energized.

The prime feature of this invention is that the minority carriers flow between the first emitter and the said one semiconductor element when a potential of a given polarity is applied, and between the second emitter and the said one semiconductor element when a potential of an opposite polarity is applied. Consequently, the semiconductor device of this invention can be energized into the critical switching state by control currents of either polarity applied to the first or second emitter.

For the purpose of simplicity and clarity the teachings of this invention will be set forth in terms of a germanium p-n-p-m semiconductor device. It will be understood, however, that the teachings of this invention are applicable as well to devices comprised of elements of silicon, silicon carbide and other suitable semiconductor materials of either p-n-p-m, n-p-n-m or p-n-p-n configuration. Examples of other semiconductor devices to which the teachings of this invention are applicable are set forth in U.S. patent application Serial No. 649,038, filed March 28, 1957, and application Serial No. 672,743, filed February 27, 1957, now Patent No. 2,886,122, the inventor and assignor of which are the same as in the instant application.

Referring now to Figs. 1 to 7, inclusive, in Fig. 1, there is illustrated a signal crystal first semiconductor element 8 comprised of germanium doped with a p-type impurity, for example, aluminum.

Figure 2:
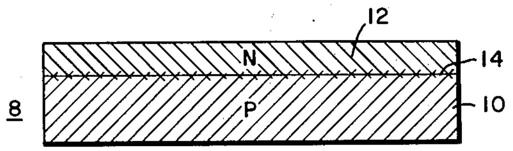

A portion of the element 8 is then doped with an n-type semiconductive impurity, for example, arsenic by any of the suitable methods known within the art. The resultant structure is illustrated in Fig. 2 and is comprised of a first p-type semiconductor layer 10 (the second base layer) and a second semiconductor layer 12 (the first base layer) of n-type semiconductivity. There is a first semiconductor transition region 14 between the p-type element 10 and the n-type element 12.

Figure 3:
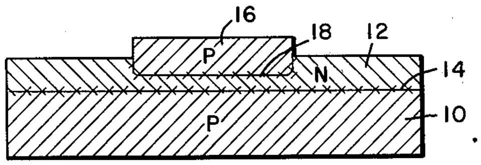

As illustrated in Fig. 3, a third semiconductor element 16 (a first emitter) of p-type semiconductivity is then formed by applying a p-type doping pellet to a perdetermined portion of the n-type layer 12. Suitable examples of the doping pellet include aluminum, indium and gallium, and may be applied as a pellet, foil or the like to the layer 12 and alloyed or bonded and diffused or introduced by any of the means commonly known in the art. Care must be exercised to assure that the element 16 does not penetrate through layer 12 to layer 10. A second semiconductor transition region 18 exists between p-type element 16 and n-type layer 12.

Figure 4:
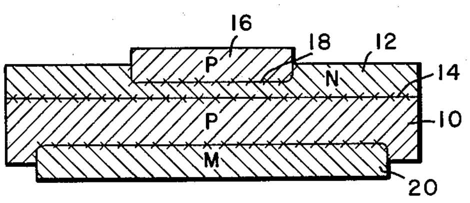

Thereafter, as illustrated in Fig. 4, a mass-of-metal 20 is joined to the first p-type semiconductor layer 10.

The mass-of-metal 20 may be joined to the element 10 by soldering, alloying, or a mass-of-metal may be electrically deposited on the element 10, or the jointure may be effected by any other means known in the art. For the proper functioning of the device of this modification, no semiconductor transition region should exist between the mass-of-metal 20 and the element 10. The formation of a transition region can be prevented by controlled cooling, if alloying is employed, of the mass-of-metal 20 and layer 10, or by any other means known in the art.

When preparing p-n-p-m devices as described herein, the mass-of-metal 20 should have neutral or p-type conductivity doping characteristics similar to that of the layer 10 to which it is joined. In general, the mass-of-metal should be either neutral or have the same type of semiconductivity doping characteristics as the element to which it is joined and to be a source of minority carriers.

One of the important functions of the mass-of-metal 20 is to provide a source of minority carriers that will flow when the entire device is subjected to proper energizing electrical current.

The nature of the minority carriers supplied by the mass-of-metal 20 is dependent upon the semiconductivity of the semiconductor elements involved. The minority carrier is an electron in p-type semiconductive material and a hole in n-type semiconductive material.

Examples of suitable masses-of-metal include:

(1) Pure indium (p-type)
(2) Pure tin (neutral)
(3) Pure lead (neutral)
(4) 50% tin, 50% indium (p-type)
(5) 10% silver, 90% indium (p-type)
(6) 5% indium, 95% tin (p-type)
(7) 99% gold, 1% antimony (n-type)
(8) 5% gold, 95% lead (neutral)
(9) 10% silver, 90% tin (neutral)
(10) 99% tin, 1% arsenic (n-type)

Figure 5:
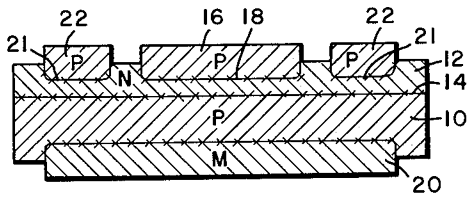

Referring to Fig. 5, a fourth semiconductor element 22 (the second emitter) having the same type conductivity as the first layer 10 and the third element 16, p-type semiconductivity in this case, is then disposed upon the surface of the n-type layer 12. The fourth element 22 can be applied in the same manner as the third element 16 or by any other method known in the art A semiconductor transition region 21 is formed between the layer 12 and the element 22.

Figure 6:
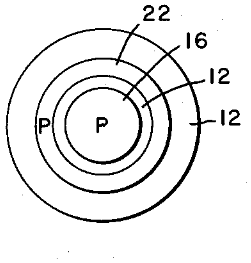

As in the formation of the element 16, care must be taken to ensure that in the application of p-type element 22 it does not penetrate sufficiently deep into n-type layer 12 to contact the p-type layer 10. In addition, p-type element 22 must be structurally isolated from p-type element 16. As illustrated in Fig. 6, the entire device may be of circular configuration.

Figure 7:
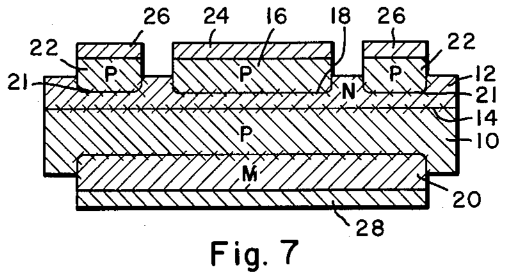

As illustrated in Fig. 7, ohmic metal contacts 24, 26 and 28 may be made to the p-type element 16, the p-type element 22 and the mass-of-metal 20 respectively to facilitate the connecting of electrical conductors to the device.

It will be understood that the order of the above steps leading to the formation of the semiconductor device incorporating the teachings of this invention is not critical and are set forth in the above order only for purposes of illustrating one method of preparation.

Figure 8:
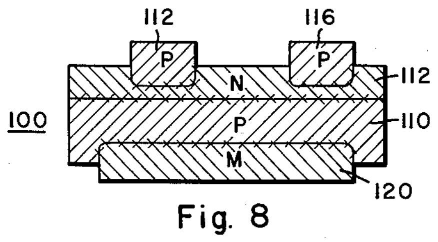
Figure 8 is a side view of a semiconductor device, with the various components shown in cross section, illustrating a second possible configuration of a device employing the teachings of this invention.

With reference to Fig. 8, there is illustrated a second possible configuration of a semiconductor device 100 incorporating the teachings of this invention. The device 100 is comprised of a single crystal first semiconductor element 110 of p-type semiconductivity to one side of which is joined a mass-of-metal 120 having p-type or neutral semiconductivity doping characteristics. An n-type semiconductivity element 112 is joined to the other side of element 110. A first dot-type emitter 116 and a second dot-type emitter 112, both of p-type semiconductivity, are attached to the n-type element 112.

In the fabrication of the device of this invention, certain geometric and electrical relationships must be observed. The semiconductor transition regions denoted respectively as 18 between p-type element 16 and n-type layer 12 and as 21 between p-type element 22 and n-type layer 12, both of which are p-n emitter junctions, should be within a diffusion length of the semiconductor transition region 14 which is between p-type element 10 and n-type layer 12. The semiconductor transition region 14 is a collector junction.

As is well known in the art, a diffusion length is the measure of distance a predetermined proportion of minority carriers will travel before absorption or trapping.

In addition, the layer 12 should have such carrier characteristics and be of such dimensions that a high proportion of all the carriers injected by either of the emitters will reach the collector junction 14.

The mass-of-metal 20 when energized provides minority carriers and, therefore, is generally located within a diffusion length of the semiconductor transition region 14 or collector junction. However, satisfactory results have been realized when the mass-of-metal and the collector junction have been spaced from considerably less than one diffusion length to several diffusion lengths apart.

To achieve a reasonable injection efficiency by an emitter into the base layer, the ratio of the conductivities of the emitter to the base must be of the order of 100 or more to 1. This can be done in the germanium model set forth herein with an aluminum doped emitter which has an acceptor density of $5\times10^{20}$ per cm.$^3$. With this high an emitter conductivity, a good emitter can be made on a base material which has a donor concentration as high as $5\times10^{18}$ per cm.$^3$, which corresponds to a resistivity of approximately $10^{-4}$ ohm-cm. With such a low resistivity, any junction made on this layer will have a low breakdown voltage in the reverse direction and conduct current easily.

The upper limit of base resistivity can be approximately calculated from the equation:

$$V_z=102R_n+48R_p$$

which gives the Zener breakdown voltage ($V_z$) of a germanium junction as a function of resistivity. $R_n$ is the resistivity of the n-type element layer and $R_p$ is the resistivity of the p-type element layer. Using the germanium model described herein and assuming that the reverse Zener voltage must be less than 0.1 volt and $R_p=10^{-6}$ ohm-cm., then $R_n=10^{-3}$ ohm-cm., corresponding to a carrier concentration approximately $10^{18}$ donors per cm.$^3$. Thus, the base layer carrier concentration can have a range of approximately $1\times10^{18}$ to $5\times10^{18}$ donors per cm.$^3$, and an emitter junction made on this layer will have good injection properties (when biased forward) but will not block current in the reverse direction. The carrier concentration range calculation above is only an indication of the practical carrier concentration which may range from $10^{17}$ to $10^{19}$ donors per cm.$^3$.

Figure 9:
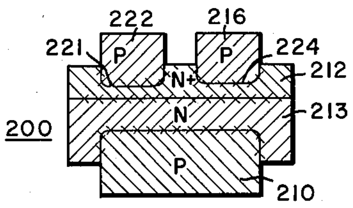
Fig. 9 is a side view of a transistor, with the various components shown in cross section, modified to incorporate the teachings of this invention.

In Fig. 9 there is illustrated a transistor semiconductor device 200 employing the techings of this invention, comprised of an n(+) type semiconductivity element 212 joined to an n-type semiconductivity element 213 with p-type semiconductivity collector element 210 joined to element 213; and a first p-type semiconductivity emitter element 216 and a second p-type semiconductivity emitter element 222, both joined to element 212. Usually in a p-n-p type transistor device the p-type emitter and p-type collector have a carrier concentration of approximately $10^{20}$ donors per cm.$^3$ and the n-type base element has a carrier concentration of $10^{15}$ donors per cm.$^3$. However, in a transistor device utilizing the teachings of this invention, a carrier concentration of $10^{15}$ donors per cm.$^3$ in the n-type element would not be sufficient to permit the flow of current between semiconductor transition regions 221 and 224. Therefore, when applying the teachings of this invention to a transistor device, it is desirable to have the n-type element divided into two zones. The first zone (denoted as 212) is an n+ zone having a carrier concentration of approximately $10^{18}$ donors per cm.$^3$, and an n-zone (denoted as 213) having a carrier concentration of approximately $10^{15}$ donors per cm.$^3$. In this manner both the desired ratio between the carrier concentration of the n-type element and the p-type collector and the necessary ratio between the carrier concentration of the p-type emitters and the n-type base element can be maintained in the same device.

Figure 10:
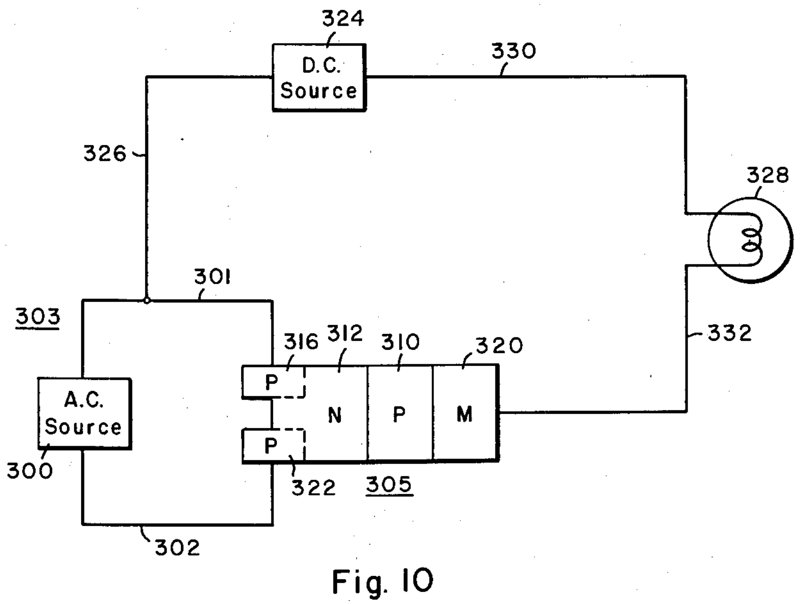
Fig. 10 is a circuit diagram illustrating a method of "turning on" a device embodying the teachings of this invention irrespective of the polarity of the energizing voltage.

Reference is now made to Fig. 10, which shows diagrammatically the functioning of devices similar to those shown in Figs. 1 to 8, incorporating the teachings of this invention, in an electrical circuit.

As illustrated, a power source 300, which may be any source of A.C. current, square wave A.C. current or an opposite polarity pulse train source, and capable of delivering current at a potential of about 1½ volts, has one terminal connected by an electrical conductor 301 to a first emitter 316 and the other terminal connected by a second electrical conductor 302 to a second emitter 322 of a semiconducor device 305. The device 305 is generally similar to the device illustrated in Fig. 8 and is comprised of the first emitter 316, the second emitter 322, a first base layer 312, a second base layer 310 and a mass-of-metal 320. The power source 300, the first emitter 316, the second emitter 322 and the conductors 301 and 302 comprise a biasing circuit 303.

A second source of power 324, which may be any source of pulsating D.C. voltage, for example either full-wave or half-wave rectified A.C. voltage, capable of delivering a high current to the device 305, has one terminal connected by a conductor 326 to the conductor 301 of biasing circuit 303 and a second terminal connected by a conductor 330 to a load 328. The other terminal of load 328 is connected by the conductor 332 to the mass-of-metal 320.

When the source 300 is energized, a voltage is impressed across the emitters 316 and 322. It will be understood that since source 300 is delivering either A.C. current or a pulse train of opposite polarity to the emitters 316 and 322, the bias of the emitters to each other will alternately be plus and minus. As long as the voltage and current from source 300 remains below a predetermined voltage, the device 305 will be in a highly resistant state and no current will flow from source 324. When a predetermined current flows through the biasing circuit 302, regardless of its polarity or direction, the device 305 becomes highly conductive, and a large or amplified current flows from the power source 324 to the mass-of-metal 320 through the load 328, and through conductors 301—326—330—332.

It will be noticed from the above description and with reference to Fig. 10 that irrespective of the polarity of the input voltage of source 300 one of the junction contacts of the emitters 316 and 322 of the device will be biased in a forward direction for efficient ejection of minority carriers.

In a semiconductor device of this kind the voltage at which it becomes highly conductive can be controlled by controlling the biasing voltage applied across the emitter and base element, and, therefore, the current flow through the emitter junction. It has been found in testing that by causing currents measured in milliamperes to flow in the biasing circuit, currents measured in amperes will flow in the load circuit. This results in a high current amplification. The merit of this device is the rapidity with which the switching may be effected. Thus, pulses from the source 300 can switch on the load circuit in 0.1 microsecond.

The following example is illustrative of the practice of this invention.

*Example I*

A circular single geranium crystal wafer of p-type semiconductivity having a thickness of 0.005 inch and a diameter of 0.250 inch was doped on one side with arsenic to a depth of 0.002 inch to form a n-type wafer.

A layer of tin having a diameter of 0.25 inch and a thickness of 0.002 inch was joined to the other side of the p-type wafer by soldering.

A p-type germanium dot emitter having a diameter of 0.080 inch and a thickness of 0.0002 inch was disposed centrally on one surface of the n-type wafer.

A p-type germanium circular emitter was disposed upon the same surface of the n-type wafer as the dot emitter by doping the n-type wafer with aluminum. The circular emitter ring was disposed about the dot emitter and had an outside diameter of 0.02 inch and an inside diameter of 0.01 inch.

The device prepared was similar to that illustrated in Figs. 5 and 6.

The device thus prepared was connected in a circuit similar to that illustrated in Fig. 10.

Figure 11:
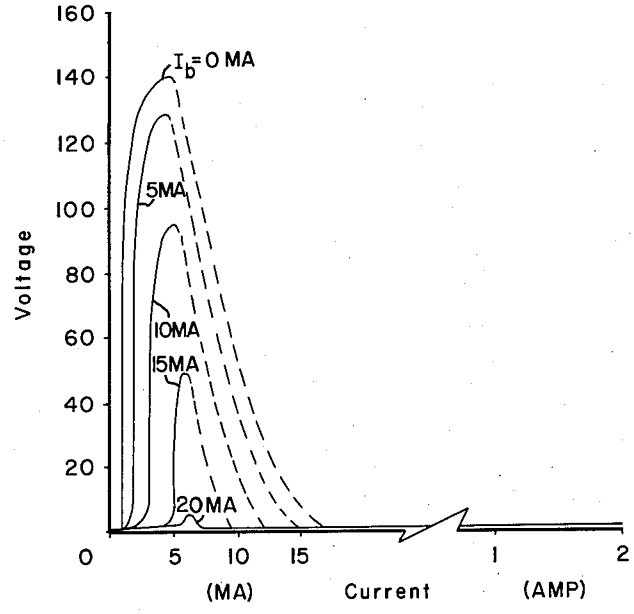
Figs. 11 and 12 illustrate graphically the switching characteristics of a bi-polar device with one first emitter biased positive with respect to a second emitter biased negative at various currents.
Figure 12:
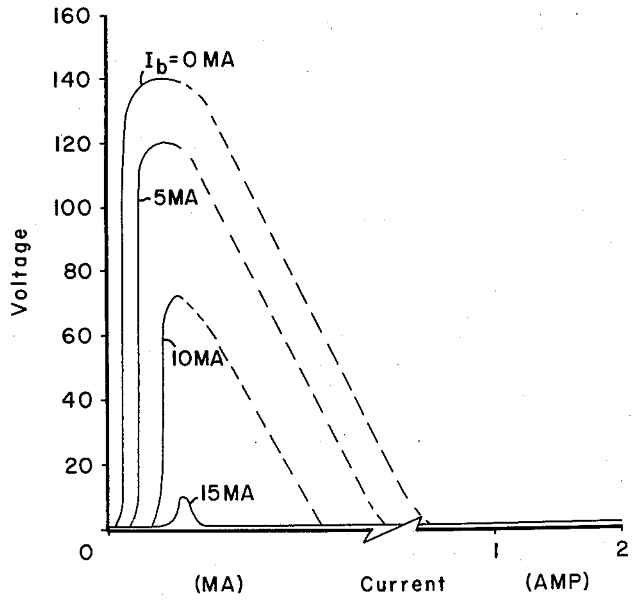

Figs. 11 and 12 graphically illustrate the voltage-ampere relationships that exist in the device prepared above when the energizing voltage between the first and second emitters is biased with a first polarity and then a second polarity.

While the invention has been described with reference to particular embodiments, it will be understood, of course, that modifications, substitutions and the like may be made therein without departing from its scope.

I claim as my invention:

1. A semiconductor device having bi-polar injecting characteristics consisting of, (1) a first single crystal semiconductor element of a first type of semiconductivity, (2) a mass-of-metal in intimate contact with one side of said first semiconductor element, said mass-of-metal providing a source of minority carriers to said first element when energized by reverse electrical potential, (3) a second semiconductor element of a second type of semiconductivity on another side of said first element, (4) a first semiconductor transition region disposed between the first and the second semiconductor elements, (5) a third semiconductor element having the same type of semiconductivity as said first element, said third element being disposed on a surface of said second element, said third element being structurally isolated from said first element, said third element serving as a first emitter element, (6) a second semiconductor transition region disposed between said second and third elements, (7) a fourth semiconductor element having the same type of semiconductivity as said first element and said third element, said fourth element being disposed on a surface of said second element, said fourth element being structurally isolated from said first element and said third element, said fourth element serving as a second emitter element, and (8) a third transition region disposed between the fourth element and the second element, said second and third transition regions being within a diffusion length of said first transition region said minority carriers flowing from the mass-of-metal to the third element and the second element when a potential of a first polarity is applied to the third element, and said minority carriers flowing to the fourth element and the second element when a potential of a second polarity is applied to the fourth element.

2. A semiconductor device having bi-polar turn-on characteristics consisting of, (1) a first single crystal semiconductor element of a first type of semiconductivity, (2) a mass-of-metal in intimate contact with one side of said first semiconductor element, said mass-of-metal providing a source of minority carriers to said first element when energized by reverse electrical potential, (3) a second semiconductor element of a second type of semiconductivity on another side of said first element, (4) a first semiconductor transition region disposed between the first and the second semiconductor elements, (5) a third semiconductor element having the same type of semiconductivity as said first element, said third element being disposed on a surface of said second element, said third element being structurally isolated from said first element, said third element serving as a first emitter element, (6) a second semiconductor transition region disposed between said second and said third elements, (7) a fourth semiconductor element having the same type of semiconductivity as said first element and said third element, said fourth element being disposed on a surface of said second element, said fourth element being structurally isolated from said first element and said third element, said fourth element serving as a second emitter element, (8) a third transition region disposed between the fourth element and the second element, said second and third transition regions being within a diffusion length of said first transition region, (9) electrical conductors in ohmic contact with the mass-of metal, the second, the third, and the fourth elements, respectively, the minority carriers flowing from the mass-of-metal to the third element and the second element when a potential of a first polarity is applied to the third element, and the minority carriers flowing to the fourth and second elements when a potential of a second polarity is applied to the fourth element.

3. A hyperconductive negative resistance semiconductor device having bi-polar turn-on characteristics consisting of, (1) a first single crystal semiconductor element of p-type semiconductivity, (2) a mass-of-metal in intimate contact with one side of the first semiconductor element, said mass-of-metal providing a source of minority carriers to said first element when energized by reverse electrical potential, (3) a second semiconductor element of an n-type semiconductivity on another side of said first element, (4) a first semiconductor transition region disposed between the first and second semiconductor elements, (5) a third semiconductor element of a p-type semiconductivity, said third element being disposed on the surface of said second element, said third element being structurally isolated from said first element, said third element serving as a first emitter element, (6) a second semiconductor transition region disposed between said second and said third elements, (7) a fourth semiconductor element of a p-type semiconductivity, said fourth element being disposed on a surface of said second element, said fourth element being structurally isolated from said first element and said third element, said fourth element serving as a second emitter element, and (8) a third transition region deposed between the fourth element and the second element, said second and third transition regions being within a diffusion length of said first transition region, the minority carriers flowing from the mass-of-metal to the third element and said second element when a potential of a first polarity is applied to the third element, and said minority carriers also flowing to the fourth element and said second element when a potential of a second polarity is applied to the fourth element.

4. A hyperconductive negative resistance semiconductor device having bi-polar turn-on characteristics consisting of, (1) a first single crystal semiconductor element of n-type semiconductivity, (2) a mass-of-metal in intimate contact with one side of said first semiconductor element, said mass-of-metal providing a source of minority carriers to said first element when energized by reverse electrical potential, (3) a second semiconductor element of p-type semiconductivity on another side of said first element, (4) a first semiconductor transition region disposed between the first and the second semiconductor elements, (5) a third semiconductor element having n-type semiconductivity, said third element being disposed on a surface of said second element, said third element being structurally isolated from said first element, said third element serving as a first emitter element, (6) a second semiconductor transition region disposed between said second and said third element, (7) a fourth semiconductor element of n-type semiconductivity, said fourth element being disposed on a surface of said second element, said fourth element being structurally isolated from said first element and said third element, said fourth element serving as a second emitter element, and (8) a third transition region disposed between the fourth and the second elements, said second and third transition regions being within a diffusion length of said first transition region, the minority carriers flowing from the mass-of-metal to the third element and the second element when a potential of a first polarity is applied to the third element, and minority carriers flowing to the fourth element and said second element when a potential of a second polarity is applied to the fourth element.

5. The semiconductor device of claim 1 in which the elements are suitably doped silicon elements.

6. The device of claim 1 in which the semiconductor elements are suitably doped germanium elements.

7. A semiconductor device having bi-polar injecting characteristics consisting of, (1) a first single crystal semiconductor element of a first-type of semiconductivity, said first semiconductor element having a top and a bottom surface, (2) a second semiconductor element of a second-type of semiconductivity in contact with the bottom surface of said first element, (3) a first semiconductor transition region disposed between the first and secon delements, (4) a third semiconductor element having said second-type of semiconductivity in contact with the top surface of said first element, (5) a second semiconductor transition region disposed between said first and said third elements, (6) a fourth semiconductor element having said first-type of semiconductivity, said fourth element being disposed on a surface of said third element, said fourth element being structurally isolated from said first element, said fourth element being an emitter element, (7) a third semiconductor transition region between said third and said fourth elements, (8) a fifth semiconductor element having said first-type of semiconductivity disposed upon the same surface of said third element as said fourth element, said fifth element being structurally isolated from said first and said fourth element, said fifth element being an emitter element and (9) a fourth semiconductor transition region disposed between said third element and said fourth element, said third and said fourth semiconductor transition regions being within a diffusion length of said second semiconductor transition region, said fourth element being energized by a potential of a first polarity and said fifth element being energized by a potential of a second polarity.

8. A semiconductor device having bi-polar injecting characteristics consisting of, (1) a first single crystal silicon semiconductor element of a first-type of semiconductivity, said first semiconductor element having a top and a bottom surface, (2) a second semiconductor element of a second-type of semiconductivity in contact with the bottom surface of said first element, (3) a first semiconductor transition region disposed between the first and second elements, (4) a third semiconductor element having said second-type of semiconductivity in contact with the top surface of said first element, (5) a second semiconductor transition region disposed between said first and said third elements, (6) a fourth semiconductor element having said first-type of semiconductivity, said fourth element being disposed on a surface of said third element, said fourth element being structurally isolated from said first element, said fourth element being an emitter element, (7) a third semiconductor transition region between said third and said fourth elements, (8) a fifth semiconductor element having said first-type of semiconductivity disposed upon the same surface of said third element as said fourth element, said fifth element being structurally isolated from said first and said fourth element, said fifth element being an emitter element, and (9) a fourth semiconductor transition region disposed between said third element and said fourth element, said third and said fourth semiconductor transition regions being within a diffusion length of said second semiconductor transition region, said fourth element being energized by a potential of a first polarity and said fifth element being energized by a potential of a second polarity.

9. A transistor having bi-polar injecting characteristics comprising in combination, (1) a first semiconductor element having a first type of semiconductivity, said first element having an area doped to a higher concentration than the remainder thereof, (2) two emitter elements of a second type of semiconductivity fused to one surface of said highly doped area of said first element, said emitter elements being structurally isolated from each other, (3) a semiconductor transition region between each of said emitter elements and said first element, (4) another semiconductor element of the second type of semiconductivity joined to a surface of the first element in the area of lesser doping concentration, and (5) a semiconductor transition region disposed between said first element and said another semiconductor element, said two emitters being capable of energizing the transistor with a potential irrespective of polarity of said potential.

References Cited in the file of this patent

UNITED STATES PATENTS

| | | |
|---|---|---|
| 2,569,347 | Shockley | Sept. 25, 1951 |
| 2,754,431 | Johnson | July 10, 1956 |
| 2,770,761 | Pfann | Nov. 13, 1956 |
| 2,779,877 | Lehovec | Jan. 29, 1957 |

UNITED STATES PATENT OFFICE
CERTIFICATE OF CORRECTION

Patent No. 2,967,793 January 10, 1961

John Philips

It is hereby certified that error appears in the above numbered patent requiring correction and that the said Letters Patent should read as corrected below.

Column 2, line 43, for the patent number "2,886,122" read -- 2,953,693 --.

Signed and sealed this 5th day of September 1961.

(SEAL)
Attest:

ERNEST W. SWIDER
Attesting Officer

DAVID L. LADD
Commissioner of Patents

USCOMM-DC